United States Patent [19]

Kern

[11] 4,214,201
[45] Jul. 22, 1980

[54] INTEGRATED CIRCUIT TESTING PROBE

[75] Inventor: Walter P. Kern, Cohasset, Mass.

[73] Assignee: Teradyne, Inc., Boston, Mass.

[21] Appl. No.: 880,788

[22] Filed: Feb. 24, 1978

[51] Int. Cl.² .................................................. G01R 1/06
[52] U.S. Cl. .................................. 324/158 P; 324/72.5
[58] Field of Search .............. 324/158 P, 158 F, 72.5, 324/149; 339/108 TP

[56] References Cited

U.S. PATENT DOCUMENTS

| 3,447,078 | 5/1969 | Levy | 324/72.5 |
|---|---|---|---|
| 3,609,539 | 9/1971 | Gunthert | 324/72.5 |
| 3,611,128 | 10/1971 | Nagata | 324/158 P |
| 3,702,439 | 11/1972 | McGahey et al. | 324/158 P |
| 3,806,800 | 4/1974 | Bove et al. | 324/158 P |
| 3,899,233 | 8/1975 | Sigel et al. | 324/72.5 |
| 3,939,414 | 2/1976 | Roch | 324/158 P |
| 3,992,073 | 11/1976 | Buchoff et al. | 324/72.5 |
| 4,035,723 | 7/1977 | Kvaternik | 324/158 P |
| 4,065,717 | 12/1977 | Kattner et al. | 324/158 P |

OTHER PUBLICATIONS

"2220 Bug Hound Fault Tracer"; General Radio Brochure; General Radio, Concord, Mass. (no date).

Primary Examiner—Rudolph V. Rolinec
Assistant Examiner—Ernest F. Karlsen

[57] ABSTRACT

Multi-tipped probe for testing integrated circuit elements, featuring, in various aspects, contact elements each resiliently biased in a rest position with a portion of itself spaced from a support and movable to an operating position against the support, the element tips being coplanar in the operating position; and contact elements having end portions oblique to an axis of the support and having peripheral edges at their ends for contacting the lead with the axis parallel to the lead.

23 Claims, 4 Drawing Figures

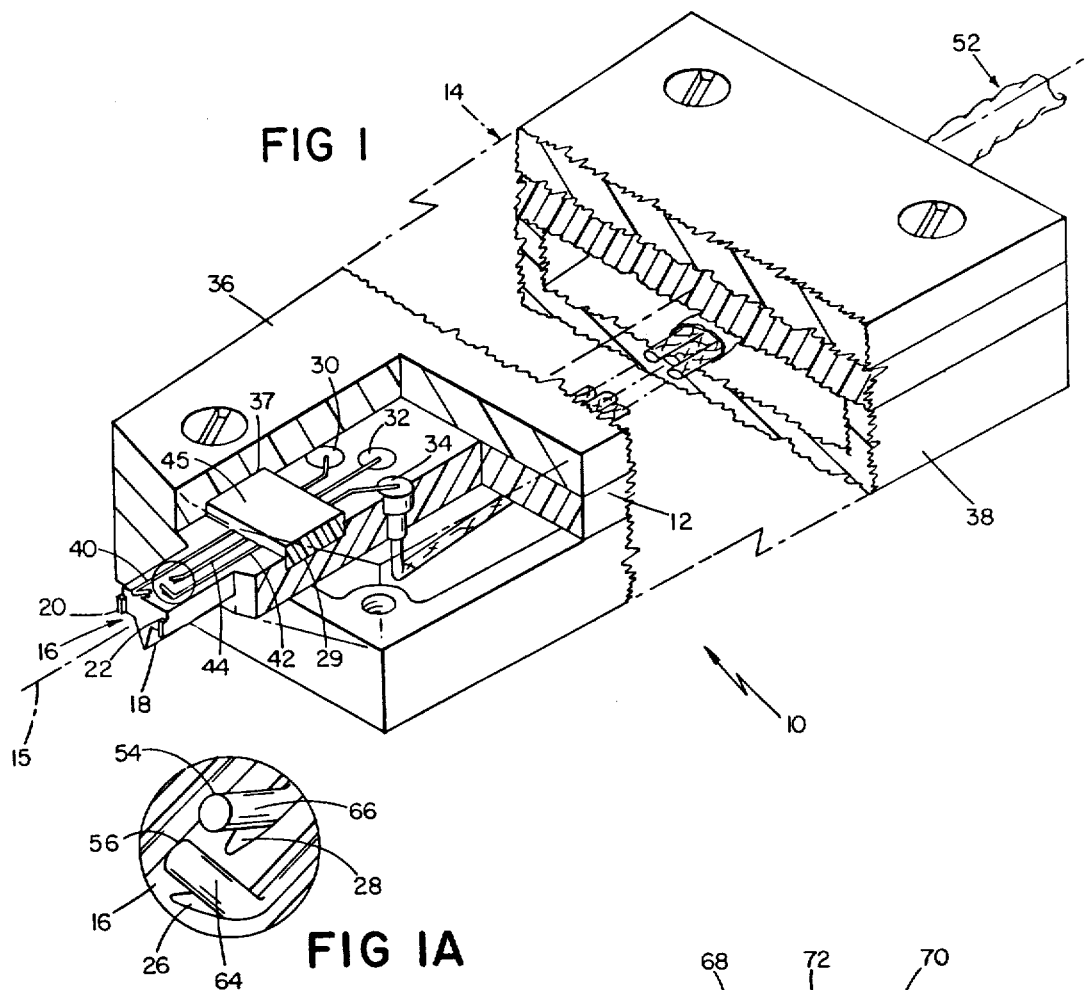
FIG 1
FIG 1A
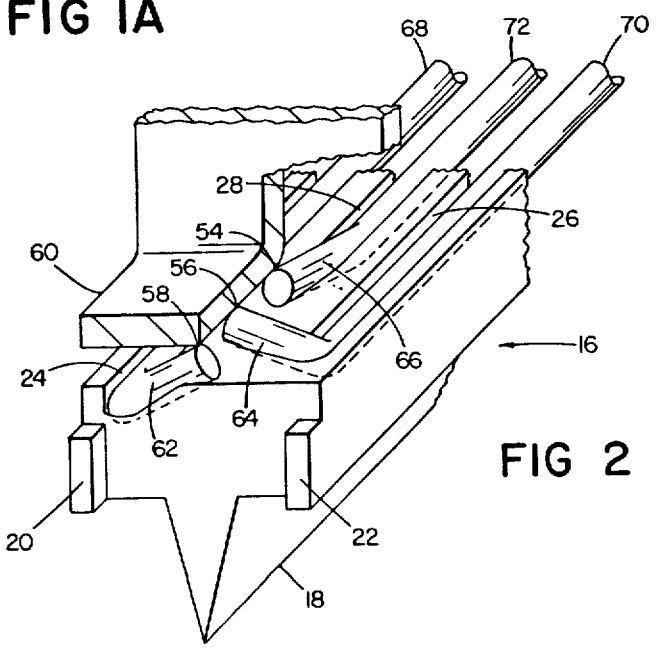
FIG 2

INTEGRATED CIRCUIT TESTING PROBE

BACKGROUND OF THE INVENTION

This invention relates to probes for testing integrated circuit elements.

In a U.S. patent application entitled "Analyzing Electrical Circuit Boards" (Ser. No. 879,881 filed Feb. 21, 1978) recently filed by Richard P. Davis (and hereby incorporated by reference) there is disclosed the desirability of being able to test a mounted integrated circuit element with a probe having two or more tips arranged to simultaneously contact the IC lead, to measure voltage drops across lead segments and to inject test signals into the lead. In another U.S. patent application entitled "Analyzing Electric Circuit Boards" (Ser. No. 880,589, filed Feb. 23, 1978), recently filed by Joseph Wrinn and Mark Hoffman (also hereby incorporated by reference) there is disclosed the desirability, in such a system, of using a probe having three tips arranged to contact the straight portion of the IC lead at three equally spaced points along a straight line, to define adjacent lead segments of precisely equal length, so that voltage drop measurements across the segments can be used in ratio to evaluate IC resistance without having to know lead resistance.

SUMMARY OF THE INVENTION

I have discovered an improved multi-tip probe useful, e.g., in systems such as those mentioned above.

In one aspect my probe features a contact element resiliently biased in a rest position with a portion of itself spaced from a support and movable to an operating position against the support, the element tips being coplanar in the operating position.

In another aspect my probe features contact elements having end portions oblique to an axis of the support and having peripheral edges at their ends for contacting the lead with the axis parallel to the lead.

In preferred embodiments, two L-shaped torsion spring contact elements and one beam spring contact element are mounted in grooves in the support. The legs of the L's that provide the contact tips are movable between their rest and operating positions in planes perpendicular to the axis so as not to change the spacing of those tips during that movement. The grooves are sloped to keep the contact element end portions oblique to the support axis in the operating position. The elements are joined for unitary replaceable mounting in sockets in the support, and the contact tips (in operating position) are spaced along a straight line and span a total distance of no more than 0.08 inch. The support has a nose adjacent the contact tips small enough to permit contact with the portion of an IC lead extending perpendicular to a circuit board on which the IC is mounted.

My probe provides the highly accurate tip placement needed for sensitive measurements (particularly of low level signals), even as the tips wear with repeated use. Excellent electrical contact with the lead is provided, particularly as the tips scrape against the lead during movement from their rest to operating positions. The tips are easily replaced, and the overall arrangement is durable, reliable, and easily used.

DESCRIPTION OF PREFERRED EMBODIMENT

We turn now to the circuitry and operation of a preferred embodiment of the invention, after first briefly describing the drawings.

Drawings

FIG. 1 is an isometric view, broken away, with a portion enlarged, of the probe.

FIG. 1A is an enlarged view of a portion of the probe shown in FIG. 1.

FIG. 2 is an enlarged view, partly in section, of the front end of the probe pressed against an integrated circuit lead part of which is broken away.

PROBE

Figure 3:
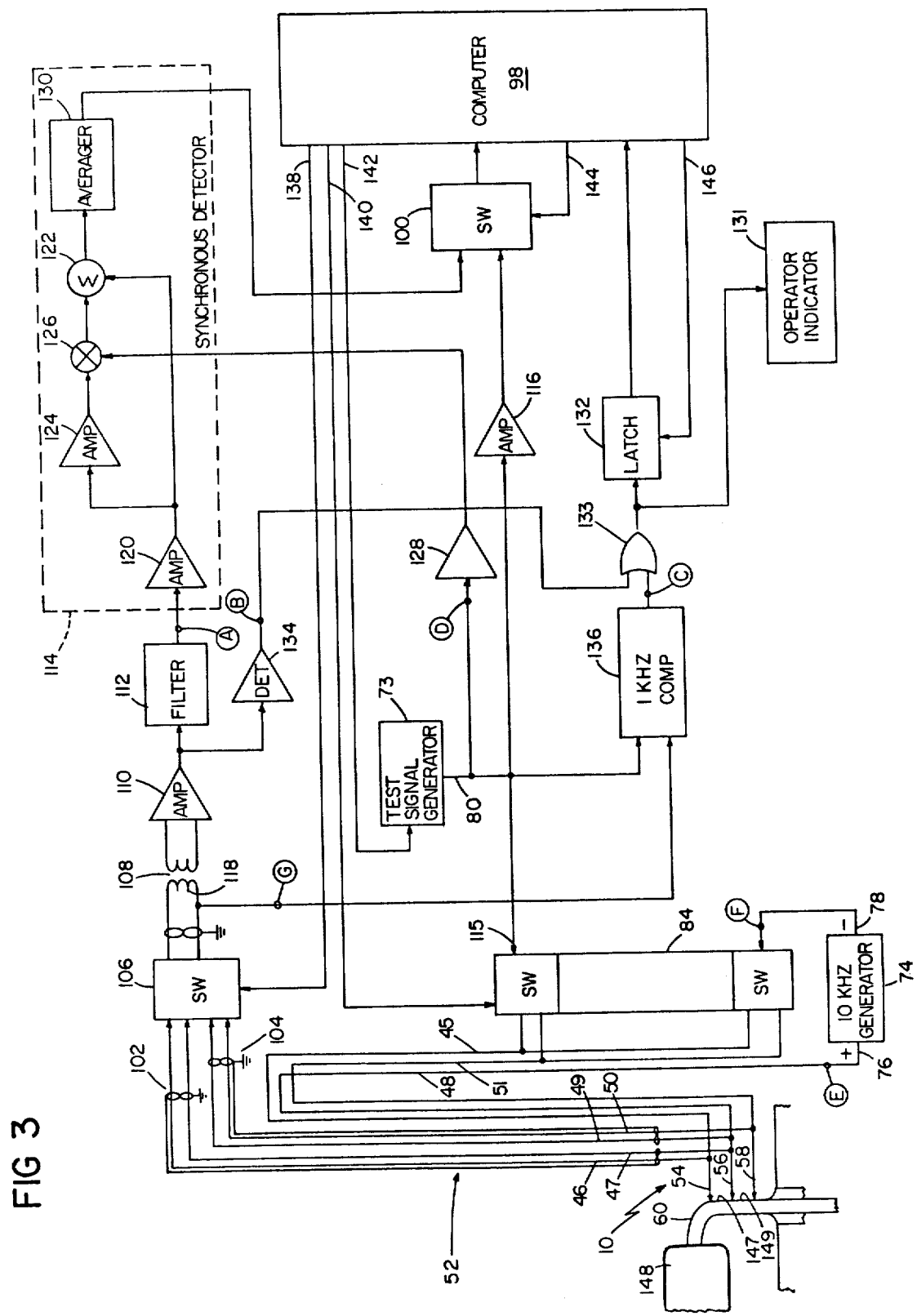
FIG. 3 is a block diagram showing the probe in conjunction with signal processing circuitry.

Referring to FIGS. 1 and 2, probe 10 has plastic support 12 forming handle 14 and tapering along axis 15 to portion 16 which is 0.13 inch wide and 0.25 inch long. Portion 16 has reinforcing ridge 18 on its back, which may be cut off if necessary (e.g., to fit between adjacent integrated circuits) and standoffs 20 and 22 extending 0.010 inch from its end. Support 12 has L shaped grooves 24 and 26 and straight groove 28 extending from sockets 30, 32, and 34 to portion 16, with groove 24 extending to and across the end of the support. The short leg of groove 26 is spaced 0.030 inch from the short leg of groove 24 and the end of groove 28 is spaced 0.030 from the short leg of groove 26. The grooves are 0.015 inch wide and 0.015 inch deep over most of their length with rounded bottoms, and decrease in depth across the short legs of grooves 24 and 26, and over the last 0.17 inch of groove 28, to zero at their ends. The grooves are interrupted, between the sockets and portion 16, by rectangular recess 29. Plastic retainer 36, which has recess 37 identical to and opposite recess 29, and lexan cover 38, are screwed to support 12.

Torsion springs 40 and 42 and beam spring 44 (each of 0.015 inch cupro-nickel wire) are mounted in block 45, which in turn is fitted into recesses 29 and 37, so that the springs lie in grooves 24, 26, and 28. The springs are bent at 90° to fit into sockets 30, 32, and 34, which are standard lead sockets (e.g., A-MP, Inc. No. 331810). Wiring cable 52 (containing cables 102 and 104 and wires 45, 48, and 51 shown more particularly in FIG. 3) is connected to the sockets and the wires pass between support 12 and cover 38 to external circuitry, being anchored in place by conventional strain relief measures (e.g., tie-straps passing through holes in support 12 and around the wires). The springs, as shown in FIG. 2, are longer than the grooves so that ends of the springs cannot be pressed below the surface of portion 16 and contact tips 54, 56, and 58, formed by the circumferential edges of the springs, will in use (as explained below) contact integrated circuit lead 60. The tips are equally spaced 0.030 inch apart and, when the tips are fully depressed by the lead 60 (FIG. 2), are coplanar and in a straight line. Ends 62, 64, and 66 of the springs form 30° angles with the face of portion 16 when not depressed. Ends 62 and 64 are each 0.06 inch long (centerline distance), end 66 is 0.17 inch long. Shafts 68, 70, and 72 generally extend along axis 15. Shafts 68 and 70 are 0.75 inch long, and shaft 72 is 0.64 inch long. Thus, all three springs have conductive paths of equal length and resistance. The overall probe is 5″ long.

CIRCUITRY

Referring to FIG. 3, inputs are provided to probe 10 by test signal generator 73 and 10 KHz generator 74, whose + output 76 is connected directly to tip 56 through wire 48 and whose − output 78 is connected, as is output 80 of generator 73, to tip 54 through wire 45 or to tip 58 through wire 51, by DPDT switch 84.

Generator 73 has selectable, positive and negative, 1 KHz square wave, and dc, current outputs at 0.1, 1.0, and 10 ma. Referring to FIG. 3, output 80 of generator 73 is provided by positive and negative current gates 86 and 88, which receive inputs from positive and negative current generators 90 and 92, computer 98, and 1 KHz oscillator 96.

Test outputs from probe 10 are provided to computer 98 through SPDT switch 100 along one path consisting of cables 102 and 104, DPDT measurement select switch 106, transformer 108, amplifier 110, filter 112, and synchronous detector 114; and along another path comprising input 115 of switch 84 and amplifier 116.

Cables 102 and 104 are twisted, individually shielded pairs with, as shown, tips 54 and 56 connected to switch 94 by, respectively, wires 46 and 47 of cable 102, and tips 56 and 58 by, respectively, wires 49 and 50 of cable 104. Thus wires 47 and 49, which connect tip 56 and switch 106, are carried separately as one of the wires in the twisted pair in each cable. This cable construction reduces cross talk and noise pickup.

Switches 84, 100, and 106 are shielded relays. The coil of switch 106 is connected to ground to reduce coil noise in the relay. Transformer 108 is individually Mu metal shielded, and has a turns ratio of 6:3000; input winding 118 is made of coaxial cable with the outer shield grounded to provide an electrostatic shield. Further shielding is provided by placing elements 106, 108, 110, 112, 134 and 136 together in a Mu metal box, and by filtering the supply voltages to this circuitry.

Amplifier 110 is a high speed impedance matching buffer having an input impedance of greater than 10 Meg ohms and a gain-bandwith product of 6 MHz. Filter 112 is a bandpass filter centered on 1 KHz and having a bandwidth of 100 Hz.

Detector 114, which functions as a phase sensitive bandpass filter centered on 1 KHz with a bandpass of 4 Hz, has one signal path from buffer amplifier 120 directly to summing point 122 and another through inverter 124 and chopper 126, which is clocked by the test signal through level shifter 128. The signal then goes through averager 130 to switch 100. Level shifter 128 shifts output 80 from a floating test signal to a ground referenced clock.

Amplifier 116 is a dc amplifier with a gain of ½.

Probe placement signals are provided to indicator 131 and, through latch 132, to computer 98 (to confirm that the three contact tips are making electrical contact with the lead) by gate 133, which has inputs from amplifier 110 through 10 KHz detector 134 and 1 KHz comparator 136 which, in turn, receives inputs from winding 118 and generator 73.

Outputs 138, 140, 142, 144, and 146 from computer 98 control the circuitry shown in FIG. 3.

OPERATION

Referring to FIG. 3, with normal operating voltages applied to the board being analyzed, probe tips 54, 56, and 58 are placed against lead 60 of integrated circuit 148 to be tested, with standoffs 20 and 22 resting (FIG. 3) against the board and straddling the meniscus of the solder joint between the lead and the board land. The tips are thus positioned along the straight lead portion between the meniscus and the curve of the lead into the integrated circuit. Probe 10 is then moved toward the lead until the springs bottom out against support 12, bringing the tips into a straight line equally spaced 0.030 inch apart, so the resistances of lead segments 147 and 149 between the tips are equal. In being pressed down, the tips dig into and slide along the lead surface, scraping corrosion from the lead and insuring good electrical contact. The deviation of tip 54 toward tips 56 and 58, as the probe is pressed against the lead, is negligible (particularly as a very slight amount of upward play is provided between shaft 72 and retainer 36, and the shaft thus bends up slightly to accommodate any tendency of tip 54 to move towards the other tips), and tips 56 and 58 rotate in planes parallel to tip 54, thereby maintaining the tips at the desired equal spacing even as the tips wear and increase their contact areas during repeated use. Grooves 24, 26, and 28 positively maintain the lateral position of the tips, contributing to accurate tip spacing.

In the presently preferred embodiment, four testing steps are then carried out under the control of computer 98 acting through control inputs 138–146, without physically moving the probe.

In the first step, the voltage normally appearing at tip 58 is measured, with no test current being injected into the lead, by connecting the input of amplifier 116 to tip 58 through switch 84 and the output of the amplifier to computer 98 through switch 100. The voltage measured is converted into a digital number within the computer by an analog to digital converter (not shown).

In the second step, a dc test current is injected into the lead through tip 58 by generator 73, and, again through amplifier 116, a measurement is made of the resulting voltage appearing at tip 58. Referring to FIG. 3, the polarity (i.e., into or out of tips 58) and magnitude (i.e., 10, 1, or 0.1 ma) of the test current is selected by control inputs 142. The polarity and magnitude of the current are selected, depending upon the type of element being analyzed, the signal normally present on the lead, and the total resistance appearing on the node, to not disturb the normal operation of the circuit. E.g., if 5400 series logic circuits are being tested, the current would typically be 1 ma or 10 ma.

In the third step, the probe outputs from tips 54 and 56 are connected, through switch 106, to winding 118, and the output of detector 114 is connected through switch 100, to computer 98. An ac test current is injected into the lead through tip 58 by generator 73 (again selected (10, 1, or 0.1 ma) not to disturb the operation of the circuit), and the voltage appearing between tips 54 and 56 due to test current flowing into the integrated circuit through the resistance of lead segment 147 is measured.

The ac voltages appearing between the tips in step 3 (as well as in step 4 described below) typically range from 30 nv to 10 $\mu$v, and the noise protection features previously discussed, i.e., the shielding of the relays and the circuitry, the twisting and shielding of the cabling, and the construction of transformer 108, together with the circuitry filtering the supply voltages and the grounding of one end of the switch 106 coil, allow these voltages to be accurately measured. Accuracy of the ac measurement is also enhanced by the use of an ac test signal and the specific sequence of transformer 108 as a high gain, low noise amplifier providing common mode noise rejection; high speed amplifier 110 to amplify both the test signal and noise, without substantial band limiting, to useful levels without distortion which would confuse the characteristics of each; filter 112 to reduce noise in preparation for synchronous detection; and synchronous detector 114, which effectively eliminates from the measurement signal all components not identical in frequency and phase with the injected test signal. Averager 130 converts the measurement signal into an integrated dc voltage proportional to the 1 KHz component of the measurement signal. The gain-bandwidth product of amplifier 110 is preferably greater than 5 MHz. The bandwidth of filter 112 is selected to be as narrow as possible, preferably no more than 10% of the center frequency, insuring that the 1 KHz test signal falls within the 3 db points of the passband as the passband drifts with age and temperature. The bandwidth of detector 114, which is determined by averager 130, is selected to be as narrow as possible while not requiring an excessive waiting period for the measurement, and is preferably less than 15 Hz.

In the fourth step, the probe outputs from tips 56 and 58 are connected, through switch 106, to winding 118, and tip 54 is connected, through switch 84, to generator 73. The ac test current is injected into the lead through tip 54, and the voltage appearing between tips 56 and 58 due to the test current flowing away from the integrated circuit through the resistance of lead segment 149 is measured.

In each of the four test steps, the placement of probe 10 against the lead is monitored by two independently operating circuits (described below) to insure proper electrical contacts (i.e., with resistances less than 0.10 ohms) between the three tips and the lead.

In the first monitoring circuit, output 76 of 10 KHz generator 74 is connected directly to contact tip 56 while output 78, which is phase shifted 180° with respect to output 76, is connected through switch 84 to tip 54 during steps 1-3 and to tip 58 during step 4. If, during each test step, the two tips connected to generator 74 are both making proper electrical contact with the lead, both outputs will be present in the lead and will cancel each other; if one of the tips is not making proper contact, only one output will be present and, being uncancelled, will pass through the probe output to 10 KHz detector 134, which will trigger latch 132, through ORing gate 133, to generate an alarm output to computer 98. The latch stores the fact of a probe placement error until released by acknowledgment output 146 from the computer. The output of gate 133 is provided directly to indicator 131, located on probe 10, without being stored.

In the second monitoring circuit, one input of comparator 136 is connected, through switch 84, to tip 58 during steps 1-3 and to tip 54 during step 4, while the other input is connected, through switch 106, to tip 56 during steps 1-3 and to tip 58 during step 4. If, during each test step, the tips connected to the comparator inputs are both making proper electrical contact with the lead, the same signal will be present on both inputs (i.e., the signal due to normal operation of the circuit, the test signal, if any, and any uncancelled output from generator 74); if either tip is not making proper contact, the inputs to the comparator will differ and, if they differ by more than 0.10 volts, comparator 136 will trigger the latch through gate 133, again providing an indication at the probe.

During test steps 1-3, therefore, the first monitoring circuit checks tips 54 and 56 and the second circuit checks tips 56 and 58, while, during step 4, the first checks tips 56 and 58 and the second checks tips 54 and 56.

The measurements made in the four test steps yield information, relating to the internal resistance of integrated circuit 148, which, as described below, is useful in diagnosing and locating faults in the circuit board. Because the tests do not disturb the normal operation of the board, faults which are best detected (and in some cases can only be detected) under normal operation conditions (i.e., with normal operating power applied to the board) can be identified: e.g., resistors and capacitors whose values change, capacitors which leak, relays and switches which have excessive contact resistance under normal operating voltages, transistors or integrated circuits having insufficient gain or excessive leakage currents, and failed transistors, internal to an integrated circuit, which cause the input or output transistors of the integrated circuit to appear to be open or short circuited.

Further details of the circuitry and its use appear in the above identified applications.

Other embodiments are within the following claims. E.g., contact springs 208, 210, and 212 of the probe might preferably be made from wire having a square cross-section, with the contact tips formed at a corner of the cross-section rather than by a curved edge as appears in the present embodiment, possibly further reducing the rate at which tip contact area increases with wear, and providing a sharper tip to dig into the lead.

I claim:

1. In a probe for electrically contacting the lead of an IC with a plurality of contact tip portions spaced apart sufficiently to permit measurement of electrical activity in a lead element therebetween, that improvement comprising a support having an axis, and a plurality of contact elements carried by said support, each said element having an operating position, at least one said element having a rest position with a portion of itself spaced from said support and being resiliently movable about said axis to an operating position against said support, said elements in said operating positions having coplanar contact tip portions, said one element having one leg extending generally along said axis and the other leg generally transverse to said axis and having said tip portion thereon, whereby said one leg acts as a torsion spring when said tip portion is moved between its rest and operating positions.

2. The probe of claim 1 wherein said tip portions are equally spaced in said operating position.

3. The probe of claim 1 wherein said rest and operating positions of said tip portion of said one element lie in a plane perpendicular to said axis.

4. The probe of claim 3 wherein a plurality of said elements have said operating and rest positions in planes perpendicular to said axis.

5. The probe of claim 4 wherein one said element has its tip portion movable between operating and rest positions in a plane parallel to said axis.

6. The probe of any of the preceding claims wherein said movable element portion is non-parallel to said axis in both said rest and operating positions, and its said tip portion is formed by an edge of said element.

7. The probe of claim 6 wherein said elements lie in grooves of said support, and said groove for said one element has a sloping section to contact said movable element portion in its said operating position.

8. The probe of any of claims 1-5 wherein each said element is so resiliently movable.

9. The probe of claim 1 wherein a plurality of said elements are so L-shaped.

10. In a probe for electrically contacting the lead of an IC with a plurality of contact tip portions spaced apart sufficiently to permit measurement of electrical activity in a lead segment therebetween, that improvement comprising a support having an axis, and a plurality of contact elements carried by said support, each said element having a main portion extending generally along said axis and an end portion non-parallel to said axis and having a blunt-ended contact tip portion having a sharp peripheral perimeter for contacting said lead with a portion of said perimeter while said support axis is parallel to the lead, said lead contacting portions of said perimeters of said plurality of elements being in a common plane when in contact with said lead, said end portions being non-perpendicular to said plane, said main portions extending alongside of one another and having their end portions at the same ends thereof, respectively.

11. The probe of any of claims 1-5 or 9-10 wherein said elements are cupro-nickel.

12. The probe of any of claims 1-5 or 9-10 wherein said tip portions span a total distance of no more than 0.08 inch.

13. The probe of any of claims 1-5 or 9-10 wherein each said contact element is removably mounted in a socket carried by said support, and wiring is connected to said sockets to establish electrical communication with said elements.

14. The improvement of claim 13 wherein said elements are joined by a member recessed in and movable from said support with said elements for replacement thereof.

15. The probe of any of claims 1-5 or 9-10 wherein said support comprises a handle for manual manipulation, and a nose at the end of said handle, said contact element tip portions being adjacent said nose, said nose being sized to permit said tip portions to contact a section of said lead extending perpendicular to the main surface of a circuit board on which said IC is mounted.

16. The probe of claim 15 wherein said nose has a reinforcing ridge on its side opposite said tip portions.

17. The probe of any of claims 1-5 or 9-10 wherein said contact tip portions are spaced along a straight line when in operating contact with said lead.

18. The probe of claims 1-5, 9 or 10 wherein said elements are of circular cross-section.

19. The probe of claim 6 wherein said edge is sufficiently sharp to dig into the surface of said lead while moving from said rest position to said operating position.

20. The probe of any of claims 1-5 or 9-10 wherein said support comprises means for positively maintaining the relative positions of said elements while in contact with said lead, so as to maintain predetermined spacing of said tip portions.

21. The probe of claim 20 wherein said means for maintaining comprises grooves in said support.

22. The probe of any of claims 1-5 or 9-10 wherein said contact elements provide conductive paths of equal length and resistance.

23. The probe of claim 5 wherein said one element has its tip portion on a short leg thereof, and said one element has a long leg extending along said axis from said short leg and arranged to flex to accommodate any tendency of said tip portion of said one element to move along said axis upon movement to its operating position.

* * * * *